United States Patent
Takahashi

(10) Patent No.: US 9,953,890 B2
(45) Date of Patent: Apr. 24, 2018

(54) SEMICONDUCTOR DEVICE

(71) Applicant: FUJI ELECTRIC CO., LTD., Kawasaki-shi (JP)

(72) Inventor: Hideaki Takahashi, Omachi (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 14/640,123

(22) Filed: Mar. 6, 2015

(65) Prior Publication Data
US 2015/0187668 A1   Jul. 2, 2015

Related U.S. Application Data

(63) Continuation of application No. PCT/JP2013/077395, filed on Oct. 8, 2013.

(30) Foreign Application Priority Data

Nov. 9, 2012 (JP) ................................. 2012-246805

(51) Int. Cl.
*H01L 23/047* (2006.01)
*H01L 23/498* (2006.01)
(Continued)

(52) U.S. Cl.
CPC .......... *H01L 23/047* (2013.01); *H01L 23/043* (2013.01); *H01L 23/49811* (2013.01);
(Continued)

(58) Field of Classification Search
CPC ... H01L 23/047; H01L 23/043; H01L 25/072; H01L 23/495
See application file for complete search history.

(56) References Cited

U.S. PATENT DOCUMENTS 5,512,782 A   4/1996 Kobayashi
6,201,696 B1 *   3/2001 Shimizu .................. H01L 23/24
                                                165/80.2
(Continued)

FOREIGN PATENT DOCUMENTS

JP       07111310 A    4/1995
JP         783087 B2   9/1995
(Continued)

OTHER PUBLICATIONS

International Search Report issued in PCT/JP2013/077395, dated Nov. 26, 2013. English translation provided.

*Primary Examiner* — Su C Kim
*Assistant Examiner* — David S Wilbert
(74) *Attorney, Agent, or Firm* — Rossi, Kimms & McDowell LLP

(57) ABSTRACT

A semiconductor device includes an insulating substrate on which semiconductor elements are mounted and a surrounding case in which the insulating substrate is housed. Two terminal conductors, both ends of each of which are fixed in sidewalls of the surrounding case, are provided between the sidewalls, and connection terminals protruding toward the insulating substrate side are provided on the respective terminal conductors. The connection terminals and a conductive foil on the insulating substrate are soldered together. Insulating blocks for keeping the distance between the adjacent terminal conductors at a fixed distance or greater are provided in the vicinity of the central portion of the terminal conductor. The insulating blocks suppress the terminal conductor being deformed by being thermally expanded when soldering. Because of this, it is possible to stabilize solderability, and it is possible to prevent an occurrence of defective connection.

8 Claims, 5 Drawing Sheets

(51) Int. Cl.
*H01L 23/043* (2006.01)
*H01L 25/07* (2006.01)
*H01L 23/373* (2006.01)

(52) U.S. Cl.
CPC ........ *H01L 23/3735* (2013.01); *H01L 25/072* (2013.01); *H01L 2924/0002* (2013.01)

(56) References Cited

U.S. PATENT DOCUMENTS

| | | | |
|---|---|---|---|
| 2009/0140414 A1* | 6/2009 | Soyano | H01L 25/072 257/698 |
| 2012/0217616 A1* | 8/2012 | Matsuoka | H01L 23/49524 257/532 |
| 2013/0119525 A1 | 5/2013 | Tsuyuno et al. | |
| 2013/0277849 A1 | 10/2013 | Fukuda | |

FOREIGN PATENT DOCUMENTS

| | | |
|---|---|---|
| JP | 10041460 A | 2/1998 |
| JP | 2000077603 A | 3/2000 |
| JP | 2012028595 A | 2/2012 |
| WO | 2012111397 A1 | 8/2012 |

\* cited by examiner

SEMICONDUCTOR DEVICE

CROSS-REFERENCE TO RELATED APPLICATIONS

This application is a continuation of International Application No. PCT/JP 2013/077395, filed on Oct. 8, 2013, which is based on and claims priority to Japanese Patent Application No. JP 2012-246805, filed on Nov. 9, 2012. The disclosure of the Japanese priority application and the PCT application in their entirety, including the drawings, claims, and the specification thereof, are incorporated herein by reference.

BACKGROUND OF THE INVENTION

1. Field of the Invention

The present invention relates to a semiconductor device.

2. Related Art

Heretofore, a semiconductor device having power semiconductor elements such as IGBTs (Insulated Gate Bipolar Transistors) has been known. The semiconductor device having power semiconductor elements, in general, has a structure wherein an insulating substrate on which semiconductor elements are mounted is mounted on a heat dissipation metal base plate, and the insulating substrate is covered with a surrounding case attached to the peripheral edge of the metal base plate.

As a heretofore known technology of this kind of semiconductor device, a structure wherein pairs of positive and negative direct current input terminals are arrayed in sidewalls, which form two opposing sides of a surrounding case having a substantially rectangular shape in plan view, so that the input terminals of the same pole are opposed to each other with an insulating substrate sandwiched therebetween, is disclosed (see, for example, Japanese Patent Application Publication No. JP-A-7-111310).

Also, as another heretofore known technology, a structure wherein two plate-like terminal conductors through which currents flow in opposite directions are disposed in a surrounding case in a condition in which the plate surfaces of the terminal conductors are parallel to and close to each other, thereby cancelling out the inductance of wires generated by a current flowing from the respective electrodes of semiconductor elements to external connection terminals, is disclosed (see, for example, Japanese Patent Application Publication No. JP-B-7-83087).

Currently, a surrounding case used in the heretofore known semiconductor devices, employing the heretofore known technologies, adopts a structure wherein two external connection terminals of the same polarity are disposed in each of sidewalls forming two opposing sides, of four peripheral sides of the surrounding case, and two terminal conductors opposed to and spaced a fixed distance from each other are provided inside the surrounding case. Connection terminals for connecting with a circuit-patterned conductive foil on the insulating substrate are formed on the respective terminal conductors. A ceramic substrate wherein a circuit-patterned conductive foil of copper (Cu) is affixed to each surface of an insulating layer made of alumina ($Al_2O_3$), aluminum nitride (AlN), or the like which is an insulating material is commonly used for the insulating substrate.

When manufacturing a semiconductor device using the heretofore described surrounding case, firstly, an insulating substrate on which semiconductor elements are mounted is mounted on and fixed to a metal base plate. Next, after the metal base plate has been covered with the surrounding case and positioned in place, the peripheral edge of the metal base plate and the surrounding base are attached by an adhesive, thereby mounting the surrounding case on the metal base plate. Further, connection terminals of terminal conductors provided in the surrounding case and a conductive foil on the insulating substrate are soldered using paste solder.

Next, a description will be given of a structure of a heretofore known semiconductor device including the surrounding case. FIGS. 7A and 7B are an illustration showing a structure of the heretofore known semiconductor device. FIG. 7A is a structure in plan view, and FIG. 7B is a structure in section view. As shown in FIGS. 7A and 7B, the heretofore known semiconductor device 100 includes a heat dissipation metal base plate 40, an insulating substrate 41, and a surrounding case 50. The insulating substrate 41 is mounted on the metal base plate 40, and the surrounding case 50 is attached to the peripheral edge of the metal base plate 40. Semiconductor elements omitted from the drawing are mounted on the insulating substrate 41.

The surrounding case 50, being a case molded from a resin, includes metal external connection terminals 63-1, 63-2, 63-3, and 63-4, and terminal conductors 60-1 and 60-2, which are integrated by insert molding. The external connection terminals 63-1, 63-2, 63-3, and 63-4 and terminal conductors 60-1 and 60-2 are molded by processing a metal plate such as a copper plate. The external connection terminals 63-1 and 63-2 and terminal conductor 60-1 are electrically connected together, and the external connection terminals 63-3 and 63-4 and terminal conductor 60-2 are electrically connected together.

The external connection terminals 63-1 and 63-2 of one polarity, which are opposed to each other with the terminal conductor 60-1 sandwiched therebetween, and the external connection terminals 63-3 and 63-4 of the other polarity, which are opposed to each other with the terminal conductor 60-2 sandwiched therebetween, are provided in sidewalls 50a and 50b forming two opposing sides, of four peripheral sides of the surrounding case 50 having a substantially rectangular shape in plan view. The terminal conductors 60-1 and 60-2 are molded integrally with the surrounding case 50, and a total of four portions at two pairs of end portions of the terminal conductors 60-1 and 60-2 are fixed in the sidewalls 50a and 50b of the surrounding case 50 using a resin. Normally, the terminal conductors 60-1 and 60-2 are disposed in the surrounding case 50 so that the plate surfaces of the terminal conductors 60-1 and 60-2 are parallel to the front surface of the insulating substrate 41 when the surrounding case 50 is placed on the metal base plate 40 in a room temperature condition.

The terminal conductor 60-1 is disposed above the insulating substrate 41 and below the terminal conductor 60-2. The shape in plan view of the terminal conductor 60-1 is substantially linear. The shape in plan view of the terminal conductor 60-2 is a shape bent so as to form the contour of a trapezoid with the lower base removed (hereafter, a trapezoidal frame shape). Also, internal wiring connection terminals 61-1 and 61-2 are provided on the terminal conductors 60-1 and 60-2 respectively. The connection terminals 61-1 and 61-2 are formed on the terminal conductors 60-1 and 60-2 in such a condition as to protrude downward in the direction, in which the insulating substrate 41 is positioned, from the respective heights at which the terminal conductors 60-1 and 60-2 are positioned (hereafter, a description will be given with the insulating substrate 41 side as the lower side and the terminal conductor 60-2 side as the upper side).

The connection terminals 61-1 and 61-2 and a conductive foil (not shown) on the insulating substrate 41 are soldered using paste solder. By soldering the connection terminals 61-1 and 61-2 and the conductive foil on the insulating substrate 41, the external connection terminals 63-1, 63-2, 63-3, and 63-4 protruding externally from the surrounding case 50 establish electrical continuity with the insulating substrate 41 on which a circuit pattern or a conductive material is laid. By so doing, the insulating substrate 41, on which are mounted the semiconductor elements inside the semiconductor device 100, and another external system can be electrically connected via the external connection terminals 63-1, 63-2, 63-3, and 63-4.

SUMMARY OF THE INVENTION

However, in the heretofore known semiconductor device 100 shown in FIG. 7, when soldering the connection terminals 61-1 and 61-2 and the conductive foil on the insulating substrate 41, the metal terminal conductors are thermally expanded and deformed by heat when soldering, meaning that the following problems arise. FIGS. 8A and 8B illustrate sectional views showing a condition when the terminal conductors of FIGS. 7A and 7B are deformed. FIG. 8A shows a condition of the inner portion of the surrounding case 50 of the semiconductor device 100 when at room temperature. FIG. 8B shows a condition of the inner portion of the surrounding case 50 of the semiconductor device 100 when soldering. FIG. 8A shows that the plate surfaces of the terminal conductors 60-1 and 60-2 are positioned parallel to the front surface of the insulating substrate 40 when at room temperature (for example, 25° C.) (a condition in which the terminal conductors 60-1 and 60-2 are not thermally deformed).

Meanwhile, FIG. 8B shows a condition in which the terminal conductor 60-1 is thermally deformed by heat when soldering. When mounting the insulating substrate 41, on which the semiconductor elements are mounted, in the surrounding case 50 and then soldering the connection terminals 61-1 and 61-2 and the conductive foil on the insulating substrate 41, the metal terminal conductors 60-1 and 60-2 thermally expand due to heat when soldering. As two ends of each of the terminal conductors 60-1 and 60-2 are fixed in the sidewalls 50a and 50b of the surrounding case 50, stress is applied to the inner side surfaces of the sidewalls 50a and 50b, in a direction substantially perpendicular thereto, by the thermally expanded terminal conductors 60-1 and 60-2, and the reaction force of the stress applied to the sidewalls 50a and 50b of the surrounding case 50 is applied to the terminal conductors 60-1 and 60-2. Because of this, the terminal conductors 60-1 and 60-2 positioned parallel to the insulating substrate 41 in a room temperature condition are deformed by an amount equivalent to the thermal expansion.

The degree of deformation of the terminal conductors due to the thermal expansion also depends on the shape in plan view of the terminal conductors. For example, in the case of the linear terminal conductor 60-1, the effect of thermal expansion leads directly to upward deformation. As opposed to this, in the case of the trapezoidal frame-shaped terminal conductor 60-2, as the directions of thermal expansion components are dispersed at the corner portions (bent portions) of the trapezoidal frame, deformation in an up-down direction is unlikely to occur. Because of this, the position of a non-fixed portion between the end portions of the trapezoidal frame-shaped terminal conductor 60-2 tends to be less likely to shift in position in the up-down direction.

Consequently, when the linear terminal conductor 60-1 is disposed on the lower side of the trapezoidal frame-shaped terminal conductor 60-2, as shown in FIGS. 7A and 7B, the upper side terminal conductor 60-2 is small in the amount of shift in position in the up-down direction, while the lower side terminal conductor 60-1 is deformed in the upward direction, and is large in the amount of shift in position in the upward direction, meaning that in particular, an insulation failure or short circuit between the external connection terminals becomes a big problem.

That is, a non-fixed portion between the end portions of the terminal conductor 60-1, when heated when soldering, is thermally expanded and thereby deformed to bend arcuately in a shape convexed upward in the direction in which the terminal conductor 60-2 is positioned. Meanwhile, the non-fixed portion between the end portions of the terminal conductor 60-2, being small in the amount of shift in position in the up-down direction due to the thermal expansion owing to the shape of the terminal conductor 60-2, remains in substantially the position before heating. As a result of this, when thermal metal expansion due to conductor heating occurs, the terminal conductor 60-1 is deformed to bend arcuately in a shape convexed in the upward direction, and a clearance occurs between the connection terminal 61-1 connecting with the terminal conductor 60-1 and the conductive foil on the insulating substrate 41. Also, there occurs a situation in which the terminal conductor 60-1 and the terminal conductor 60-2 come near to each other, and in the worst case, come into contact with each other.

In this way, with the heretofore known semiconductor device 100, it is confirmed that there is a case in which a clearance occurs between the connection terminal 61-1 and the conductive foil on the insulating substrate 41 due to heat when soldering the connection terminals 61-1 and 61-2 and the conductive foil on the insulating substrate 41. Also, it is confirmed that there is a case in which the terminal conductor 60-1 comes near to the terminal conductor 60-2. When a clearance occurs between the connection terminal 61-1 and the conductive foil on the insulating substrate 41, solderability deteriorates, thus causing defective connection. Furthermore, the two terminal conductors 60-1 and 60-2 opposed to and spaced a fixed distance from each other come near to each other, thus leading to an insulation failure or a short circuit.

SUMMARY OF THE INVENTION

In order to solve the heretofore described problems raised by the heretofore known technologies, an object of the invention is to provide a semiconductor device wherein solderability is stabilized to prevent an occurrence of an insulation failure or short circuit between terminal conductors.

In order to solve the heretofore described problems and achieve the object of the invention, a semiconductor device according to the invention has the following features. An insulating substrate on which semiconductor elements are mounted is disposed. A surrounding case which surrounds the insulating substrate is disposed. At least two metal plate-like terminal conductors are disposed on the top of the insulating substrate, parallel to the front surface of the insulating substrate, so as to be opposed to and spaced away from each other so that the distances between the terminal conductors and the insulating substrate are different from each other. Both ends of each of the terminal conductors are fixed in sidewalls of the surrounding case. An insulating block for keeping the distance between the adjacent terminal conductors at a fixed distance or greater is disposed between the adjacent terminal conductors.

Also, the semiconductor device according to the invention is characterized in that in the heretofore described aspect of the invention, the insulating block is provided so as to encompass one portion of the terminal conductor.

Also, the semiconductor device according to the invention is characterized in that in the heretofore described aspect of the invention, the insulating block is formed from a polyphenylene sulfide resin or an epoxy resin.

Also, the semiconductor device according to the invention is characterized in that in the heretofore described aspect of the invention, the distance between the terminal conductors kept by the insulating block is 0.5 mm or more and 5 mm or less.

Also, the semiconductor device according to the invention further has the following features in the heretofore described aspect of the invention. A conductive foil is formed on the insulating substrate in a predetermined pattern. Connection terminals are formed on the respective terminal conductors. The connection terminals are soldered to the conductive foil. Further, the insulating block, by coming into contact with the terminal conductor, suppresses thermal deformation of the terminal conductor which is thermally expanded by heat when soldering the connection terminals and the conductive foil.

According to the heretofore described aspect of the invention, by providing the kind of insulating block, which keeps the distance between the adjacent terminal conductors at a fixed distance or greater, between at least two terminal conductors opposed to and spaced a fixed distance from each other, it is possible to minimize the deformation of the terminal conductors caused by the thermal expansion thereof when soldering. Because of this, as the soldering of the connection terminals is stabilized, not only is it to possible to reduce defective connection, but it is also possible to prevent an insulation failure or short circuit between at least two terminal conductors opposed to and spaced a fixed distance from each other.

According to the semiconductor device of the invention, the effect of being able to provide a semiconductor device wherein it is possible to stabilize the solderability of the terminal conductors to another member, thus preventing an occurrence of an insulation failure or short circuit between the terminal conductors, is produced.

DETAILED DESCRIPTION

Hereafter, a detailed description will be given, referring to the accompanying drawings, of a preferred embodiment of a semiconductor device according to the invention. In the following description of the embodiment and the accompanying drawings, the same components will be given the same signs, and a redundant description will be omitted.

Embodiment

Figure 1A:
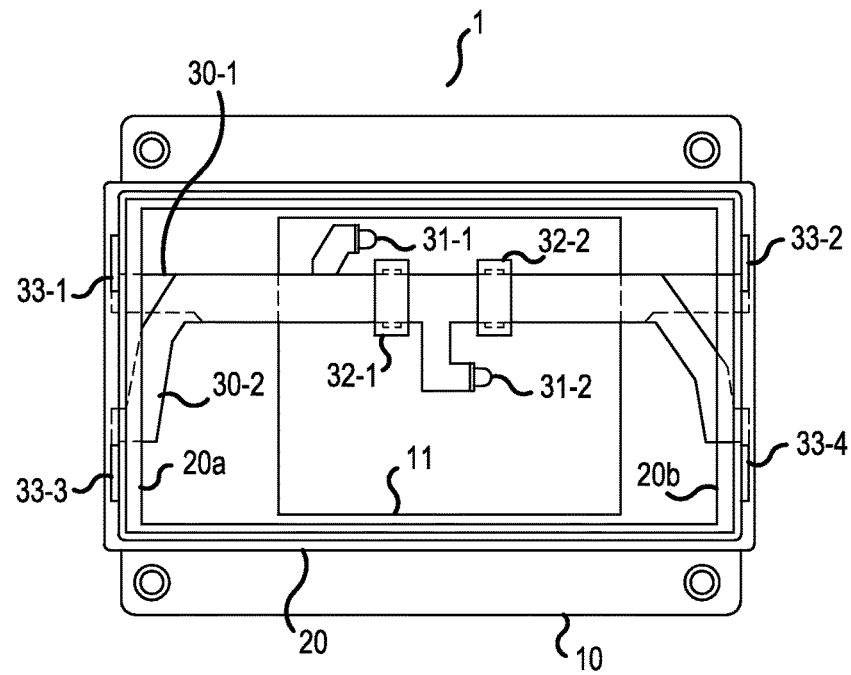
FIGS. 1A and 1B are an illustration showing a structure of a semiconductor device according to an embodiment of the invention.
Figure 1B:
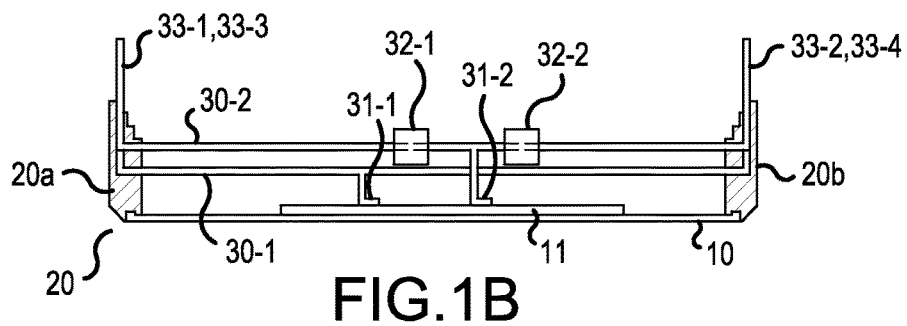

A description will be given of a structure of a semiconductor device according to the embodiment of the invention. FIGS. 1A and 1B are an illustration showing a structure of the semiconductor device according to the embodiment of the invention. FIG. 1A is a structure in plan view, and FIG. 1B is a structure in sectional view. As shown in FIGS. 1A and 1B, the semiconductor device 1 according to the embodiment includes a heat dissipation metal base plate 10, an insulating substrate 11, and a surrounding case 20. The insulating substrate 11 is mounted on the metal base plate 10. The surrounding case 20 is attached to the peripheral edge of the metal base plate 10. An unshown circuit pattern of conductive foil is provided on either surface of the insulating substrate 11. Semiconductor elements (not shown) are mounted on the conductive foil of a surface on the opposite side of the insulating substrate 11 from the metal base plate 10 side.

The surrounding case 20, being a case molded from a resin, has, for example, a substantially rectangular shape in plan view. Also, the surrounding case 20 includes metal external connection terminals 33-1, 33-2, 33-3, and 33-4, and terminal conductors 30-1 and 30-2. The external connection terminals 33-1, 33-2, 33-3, and 33-4 and the terminal conductors 30-1 and 30-2 are such that a metal plate such as a copper (Cu) plate is processed and molded. The external connection terminals 33-1 and 33-2 and the terminal conductor 30-1 are electrically connected together, and the external connection terminals 33-3 and 33-4 and the terminal conductor 30-2 are electrically connected together.

The external connection terminals 33-1, 33-2, 33-3, and 33-4 are provided in sidewalls 20a and 20b which form two opposing sides, of four peripheral sides of the surrounding case 20. The external connection terminals 33-1, 33-2, 33-3, and 33-4, being pairs of positive and negative direct current input terminals, are arrayed so that the external connection terminals of the same pole face (are opposed to) each other with each respective terminal conductor 30-1 and 30-2 sandwiched therebetween. The terminal conductors 30-1 and 30-2 are molded integrally with the surrounding case 20, and a total of four portions at two pairs of end portions of the terminal conductors 30-1 and 30-2 are fixed in the sidewalls 20a and 20b of the surrounding case 20. It is good that the terminal conductors 30-1 and 30-2 are disposed in the surrounding case 20 so that the plate surfaces of the terminal conductors 30-1 and 30-2 are parallel to the front surface of the insulating substrate 11 when the surrounding case 20 is placed on the metal base plate 10 in a room temperature condition.

The terminal conductor 30-1 and the terminal conductor 30-2 are disposed so that the plate surfaces thereof are opposed to and close to each other in order to reduce the inductance of wires. When disposing the terminal conductors 30-1 and 30-2 close to each other, the distance at which they are brought close to each other is suitably, for example, on the order of 0.5 mm or more and 5 mm or less. The reasons are as follows. One reason is that when the distance between two opposing electrodes (the terminal conductors 30-1 and 30-2) is set to 0.5 mm or less, a problem is likely to arise in the process of injecting, for example, an epoxy resin into the surrounding case 20 and hermetically sealing the insulating substrate 11 and semiconductor elements in the latter half stage of manufacturing steps, to be described hereafter, for assembling the semiconductor device 1. Meanwhile, the other reason is that when the distance between the two opposing electrodes is set to 5 mm or more, there is a problem that the effect of reducing the inductance decreases. For example, the distance between the two opposing electrodes (terminal conductors 30-1 and 30-2) is set to 2 mm.

The terminal conductor 30-1 is positioned above the insulating substrate 11 and below the terminal conductor 30-2. The terminal conductor 30-2 is positioned, for example, on the uppermost side in the surrounding case 20. The shape in plan view of the terminal conductor 30-1 is, for example, substantially linear. The shape in plan view of the terminal conductor 30-2 is, for example, a shape bent so as to form the contour of a trapezoid with the lower base removed (a trapezoidal frame shape). The terminal conductors 30-1 and 30-2 are provided with internal wiring connection terminals 31-1 and 31-2 respectively. The connection terminals 31-1 and 31-2 are formed in such a condition as to protrude downward in the direction in which the insulating substrate 11 is positioned (hereafter, a description will be given with the insulating substrate 11 side as the lower side and the terminal conductor 30-2 side as the upper side). Also, insulating blocks 32-1 and 32-2 formed using, for example, an epoxy resin are disposed in respective positions on the terminal conductor 30-2, for example, in the vicinity of the center between the sidewalls 20a and 20b of the surrounding case 20.

The connection terminals 31-1 and 31-2 protruding downward from the terminal conductors 30-1 and 30-2 and the conductive foil on the insulating substrate 11 are soldered by paste solder. By soldering the connection terminals 31-1 and 31-2 and the conductive foil on the insulating substrate 11, the external connection terminals 33-1, 33-2, 33-3, and 33-4 protruding externally from the surrounding case 20 establish electrical continuity with the insulating substrate 11 on which a circuit pattern or a conductive material is laid. By so doing, the insulating substrate 11, on which are mounted the semiconductor elements inside the semiconductor device 1, and another external system can be electrically connected via the external connection terminals 33-1, 33-2, 33-3, and 33-4.

The insulating blocks 32-1 and 32-2 are disposed between the adjacent terminal conductors 30-1 and 30-2 disposed so as to be opposed to and spaced a fixed distance from each other. The insulating blocks 32-1 and 32-2 are provided, apart from each other, in predetermined portions of the upper side terminal conductor 30-2 so as to encompass one portion of the terminal conductor 30-2. The details of the shape, thickness, and the like of the insulating blocks 32-1 and 32-2 will be described hereafter. The terminal conductor 30-1, which is deformed by being thermally expanded when soldering the connection terminals 31-1 and 31-2 and the conductive foil on the insulating substrate 11, comes into contact with the insulating blocks 32-1 and 32-2, and the terminal conductor 30-1 is held by the insulating blocks 32-1 and 32-2. By so doing, the deformation of the terminal conductor 30-1 is suppressed, and the insulating blocks 32-1 and 32-2 have the function of keeping the distance between the adjacent terminal conductors 30-1 and 30-2 at a fixed distance or greater.

Specifically, when soldering the connection terminals 31-1 and 31-2 and the conductive foil on the insulating substrate 11, the metal terminal conductors 30-1 and 30-2 are thermally expanded by heat when soldering. At this time, the terminal conductor 30-1 tends to deform in a shape convexed upward in the direction in which the terminal conductor 30-2 is positioned, for example, in an arcuate shape due to the linear shape of the terminal conductor 30-1, as heretofore described. The deformation of the terminal conductor 30-1 in the upward direction can be suppressed by the insulating blocks 32-1 and 32-2 provided on the terminal conductor 30-2. Also, as the terminal conductor 30-2 is positioned on the uppermost side, when the terminal conductor 30-2, by being thermally expanded, tends to deform in the upward direction in the same way as the terminal conductor 30-1, the deformation of the terminal conductor 30-2 can be suppressed by physical means such as by being held from above by another member (not shown).

In this way, the insulating blocks 32-1 and 32-2 have the effect of, when soldering the connection terminals 31-1 and 31-2 and the conductive foil on the insulating substrate 11, suppressing the thermal deformation of the terminal conductor 30-1 due to soldering heat so as to prevent the terminal conductor 30-1 from coming near to the terminal conductor 30-2. Because of this, it is possible to suppress a clearance (gap) occurring between the connection terminal 31-1 of the terminal conductor 30-1 and the conductive foil on the insulating substrate 11 during heating when soldering. Because of this, the solderability of the connection terminals 31-1 and 31-2 to the conductive foil on the insulating substrate 11 is stabilized, and it is thus possible to prevent an occurrence (interval) of defective connection. Furthermore, as the distance between the terminal conductor 30-1 and the terminal conductor 30-2 can be kept at a fixed value or greater by the insulating blocks 32-1 and 32-2, it is possible to prevent an insulation failure or short circuit due to the two opposing terminal conductors 30-1 and 30-2 coming near to each other.

A material used for the insulating blocks 32-1 and 32-2 is preferably, for example, a polyphenylene sulfide resin or an epoxy resin. The reason is that a polyphenylene sulfide resin or an epoxy resin, being an insulating material which is stable at a high temperature, is easy to mold.

Figure 2:
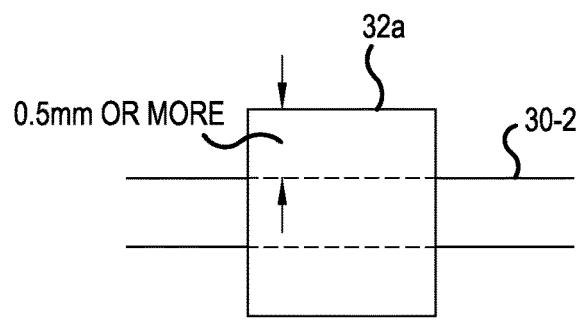
FIG. 2 is a side view showing a shape of an insulating block of FIGS. 1A and 1B.

Next, a description will be given of the shape of the insulating blocks 32-1 and 32-2. FIG. 2 is a side view showing a shape of the insulating block of FIG. 1. FIG. 2 shows in enlarged dimension the vicinity of an insulating block 32a of the semiconductor device 1 with the insulating blocks 32-1 and 32-2 of FIGS. 1A and 1B as the insulating block 32a. As shown in FIG. 2, the insulating block 32a may be formed in a quadrangular shape. By forming the insulating block 32a in a quadrangular shape, it is possible to easily carry out the formation of the insulating block 32a. Also, the thickness of a portion of the insulating block 32a protruding from each surface of the terminal conductor 30-2 toward the terminal conductor 30-1 side is preferably 0.5 mm or more and 5 mm or less which is a distance needed between the opposing terminal conductors 30-1 and 30-2, and is set to, for example, 1.5 mm.

Figure 3:
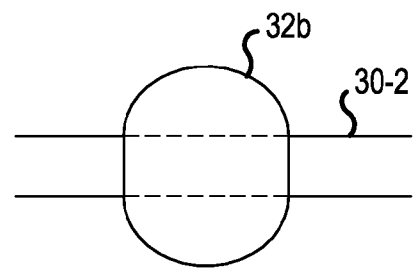
FIG. 3 is a side view showing another example of a shape of the insulating block of FIGS. 1A and 1B.
Figure 4:
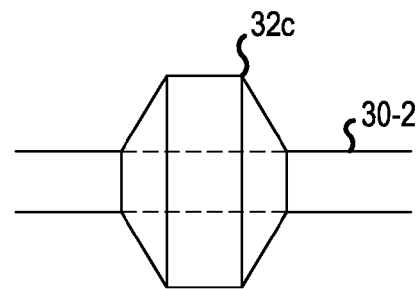
FIG. 4 is a side view showing another example of a shape of the insulating block of FIGS. 1A and 1B.

FIGS. 3 and 4 are side views showing other examples of the shape of the insulating blocks of FIGS. 1A and 1B. FIGS. 3 and 4 show variations of the shape of the insulating blocks 32-1 and 32-2 of FIGS. 1A and 1B as insulating blocks 32b and 32c. The insulating block 32b shown in FIG. 3 is such that a portion thereof protruding from each surface of the terminal conductor 30-2 has a round shape. The insulating block 32c shown in FIG. 4 is such that a portion thereof protruding from each surface of the terminal conductor 30-2 has a trapezoidal shape. The insulating blocks 30a to 30c are formed so as to encompass the terminal conductor 30-2. Also, with the insulating blocks 30a to 30c, at least one insulating block only has to be provided on the terminal conductor 30-2, and two insulating blocks may be disposed on the terminal conductor 30-2, or furthermore, a plurality of insulating blocks may be formed on the terminal conductor 30-2.

Figure 5:
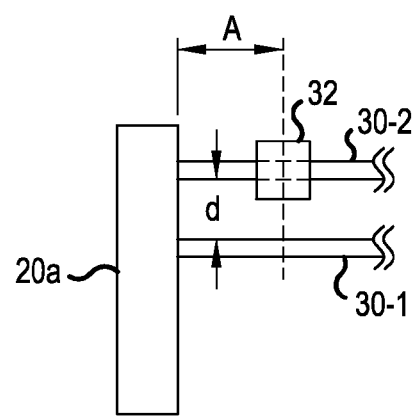
FIG. 5 is a side view showing one example of a position in which is mounted the insulating block of FIGS. 1A and 1B.

Next, a description will be given of a mounting position of an insulating block 32. FIG. 5 is a side view showing one example of a mounting position of the insulating block of FIGS. 1A and 1B. FIG. 5 shows in enlarged dimension the vicinity of the insulating block 32 of the semiconductor device 1 with the insulating blocks 32-1 and 32-2 of FIGS. 1A and 1B as the insulating block 32. A distance A from the sidewall 20a of the surrounding case to the center of the insulating block 32 is determined by taking into account a distance d between the terminal conductors 30-1 and the terminal conductor 30-2 when at room temperature (in an undeformed condition), the amount by which the terminal conductor 30-1 is deformed when thermally expanded, and the thickness of a portion of the insulating block 32 protruding from each surface of the terminal conductor 30-2 toward the terminal conductor 30-1 side. That is, the position of the insulating block 32 is set to a position such that the dielectric strength voltage between the terminal conductor 30-1 and the terminal conductor 30-2 can secure a necessary value even when the terminal conductor 30-1 is thermally expanded and thereby deformed to come into contact with the insulating block 32. The position of the insulating block 32 may be determined as an optimum position by taking into account, for example, the structure and assemblability of the semiconductor device based on the centers of the fixed end portions of the terminal conductors 30-1 and 30-2.

In order to secure the dielectric strength voltage between the terminal conductors 30-1 and 30-2 regardless of the amount of deformation of the terminal conductor 30-1, it is desirable that the insulating block 32, the thickness of which is greater than the distance d between the terminal conductor 30-1 and the terminal conductor 30-2 which is equivalent to a necessary dielectric strength voltage, is disposed in the vicinity of the center of the terminal conductor 30-2 which is a portion in which the terminal conductor 30-1, when thermally deformed, comes nearest to the terminal conductor 30-2.

The heretofore described shapes of the insulating blocks are one example, and the invention, not being limited to these, can be variously modified. For example, as long as the deformation in the upward direction of the terminal conductor 30-1 due to the thermal expansion thereof can be suppressed to keep the distance between the terminal conductor 30-1 and the terminal conductor 30-2 at a fixed distance or greater, the shape of the insulating block may be optional.

Also, the insulating block is formed so as to encompass the terminal conductor 30-2, and provided on the terminal conductor 30-2. Furthermore, it is good that each insulating block 32a to 32c is provided in a central position between both resin end surfaces (inner side surfaces of the sidewalls of the surrounding case) in which the terminal conductor 30-2 is fixed, that is, in the vicinity of the central portion of the terminal conductor 30-2. The distance between each insulating block 32a to 32c and each resin end surface is, for example, on the order of approximately 50 mm.

By installing the insulating block 32 in the vicinity of the central portion of the terminal conductor 30-2, as heretofore described, it is possible, even when the terminal conductor 30-1 is thermally expanded and thereby deformed, to suppress so as to prevent the terminal conductor 30-1 from coming near to the terminal conductor 30-2. Also, by suppressing the deformation of the terminal conductor 30-1 using the insulating block 32, it is possible to suppress a clearance occurring between each connection terminal 31-1 and 31-2 and the conductive foil on the insulating substrate 11.

A description has heretofore been given, as an example, of a case in which two insulating blocks 32 are provided in the vicinity of the central portion of the terminal conductor 30-2, but a configuration may be such that the insulating block 32 is provided in a portion of the terminal conductor 30-2 opposite to the vicinity of the central portion of the terminal conductor 30-1. Also, a configuration may be such that the insulating block 32 is provided so as to straddle both the terminal conductors 30-1 and 30-2. When adopting a configuration wherein the insulating block 32 is provided so as to straddle both the terminal conductors 30-1 and 30-2, the insulating block 32, as it enables the distance (interval) between the two terminal conductors 30-1 and 30-2 opposed to and spaced away from each other to be kept at a fixed distance, has the effect of reducing variation in the inductance of wires.

Figure 6:
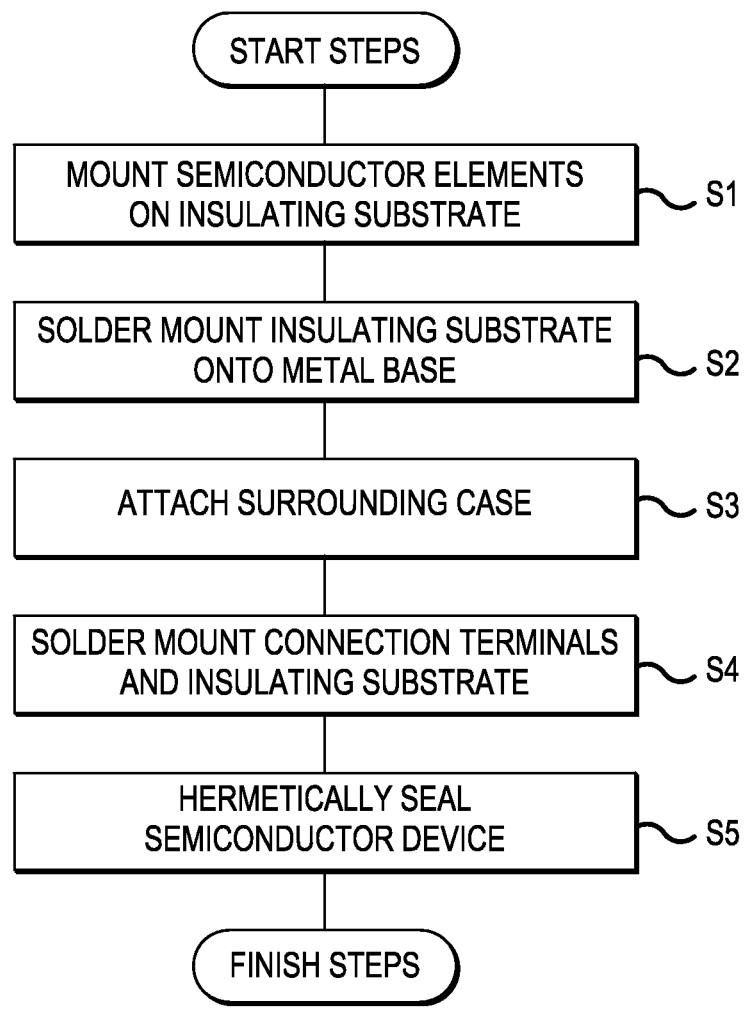
FIG. 6 is a flow chart showing an outline of steps of manufacturing the semiconductor device according to the embodiment of the invention.
Figure 7A:
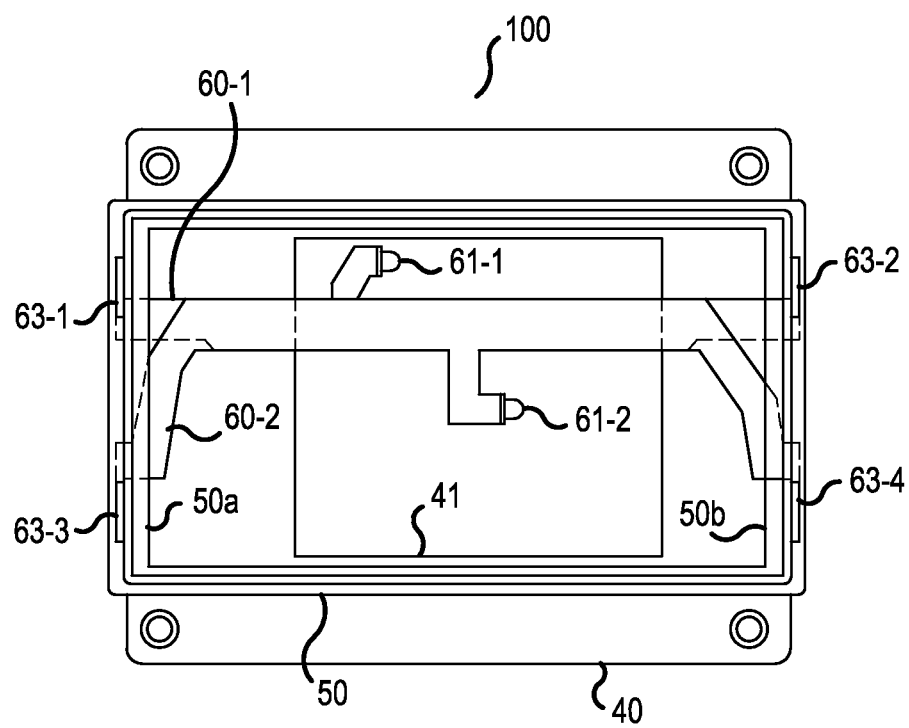
FIGS. 7A and 7B are an illustration showing a structure of a heretofore known semiconductor device.
Figure 7B:
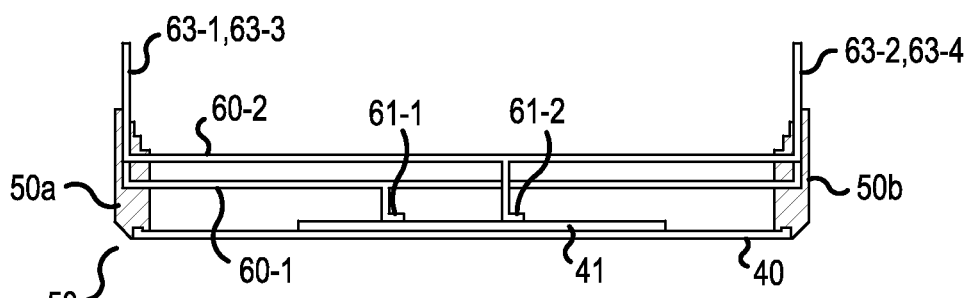
Figure 8A:
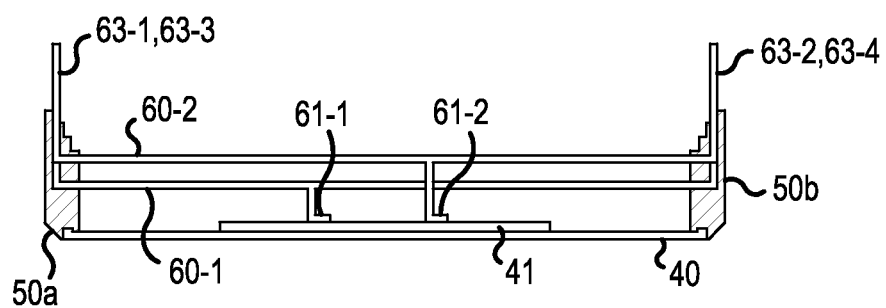
FIGS. 8A and 8B illustrate sectional views showing a condition when terminal conductors of FIGS. 7A and 7B are deformed.
Figure 8B:
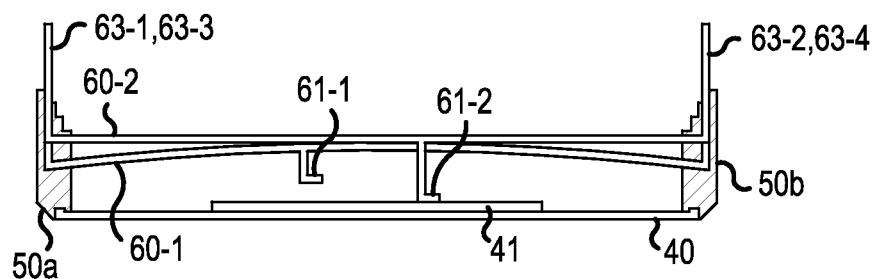

Next, a description will be given, referring to the flow chart, of the steps of manufacturing the semiconductor device 1 according to the embodiment. FIG. 6 is a flow chart showing an outline of the steps of manufacturing the semiconductor device according to the embodiment of the invention. Firstly, semiconductor elements are mounted on the insulating substrate 11 (step S1). Next, the insulating substrate 11 is mounted on the metal base plate 10 by soldering (step S2). Next, the surrounding case 20 is mounted on the metal base plate 10 by attaching the surrounding case 20 to the peripheral edge of the metal base plate 10 (step S3).

The metal terminal conductors 30-1 and 30-2 integrally molded so as to be positioned between the opposing sidewalls 20a and 20b are provided in advance in the surrounding case 20. Also, the insulating blocks 32-1 and 32-2 are provided in advance in, for example, respective positions on the terminal conductor 30-2 in the vicinity of the central portion between the opposing sidewalls 20a and 20b of the surrounding case 20. The insulating blocks 32-1 and 32-2 have the effect of suppressing the deformation of the terminal conductor 30-1 due to thermal expansion so as to prevent the terminal conductor 30-1 from being deformed in the upward direction by soldering heat to come near to the terminal conductor 30-2 when soldering the connection terminals 31-1 and 31-2 and the conductive foil on the insulating substrate 11.

Next, the connection terminals 31-1 and 31-2 formed on the terminal conductors 30-1 and 30-2 and the conductive foil on the insulating substrate 11 are soldered (step S4). At this time, by the insulating blocks 32-1 and 32-2 being provided on the terminal conductor 30-2, the deformation of the terminal conductor 30-1 is suppressed so as to prevent the terminal conductor 30-1 from coming near to the upper side, on which the terminal conductor 30-2 is positioned, even due to heat when soldering. Subsequently, for example, an epoxy resin (not shown) is injected into the inner portion of the surrounding case 20 to hermetically seal the semiconductor elements and the insulating substrate 11, and an upper cover (not shown) of the surrounding case 20 is fixed to the surrounding case 20 by an adhesive (step S5). By so doing, the semiconductor device 1 shown in FIGS. 1A and 1B is completed.

As heretofore described, according to the invention, by providing an insulating block on a terminal conductor, it is possible to suppress a terminal conductor, which is opposed to and spaced a fixed distance from the terminal conductor, being deformed by thermal expansion occurring therein when heated as a result of soldering. Because of this, it is possible to adopt a configuration wherein the terminal conductor, which is deformed by thermal expansion occurring therein when heated as a result of soldering, does not bend upward in the direction in which the other terminal conductor opposed to and spaced a fixed distance from the terminal conductor is positioned. By so doing, it is possible to suppress a clearance occurring between a connection terminal protruding from each terminal conductor and a conductive foil on an insulating substrate when soldering. Consequently, it is possible to avoid the connection terminals from separating from and coming off the insulating substrate when soldering. Because of this, the solderability of the connection terminals to the conductive foil on the insulating substrate is stabilized, and it is thus possible to prevent an occurrence of defective connection. Furthermore, it is also possible to prevent an insulation failure or short circuit between at least two terminal conductors opposed to and spaced a fixed distance from each other.

As above, the invention, not being limited to the heretofore described embodiment, can be variously modified without departing from the scope of the invention. For example, in the heretofore described embodiment, a description has been given, as an example, of a configuration wherein the lower side linear terminal conductor and the upper side trapezoidal frame-shaped terminal conductor are disposed, that is, a configuration wherein it is easy for the terminal conductors, which are opposed to and spaced a fixed distance from each other, to come near to each other, but the same effect is also produced when each terminal conductor has another shape. That is, when the linear terminal is disposed on the upper side in place of the upper side trapezoidal frame-shaped terminal conductor, too, there is fear that the lower side linear terminal conductor is deformed in the upward direction in an arcuate shape when the upper side linear terminal conductor is physically held and kept from deforming by an unshown member when soldering the connection terminals to the conductive foil on the insulating substrate, thus raising the same problem as heretofore known. In this case too, as it is difficult to hold the lower side linear terminal conductor, it is preferable to apply the invention. Also, when the trapezoidal frame-shaped terminal conductor is disposed on the lower side in place of the lower side linear terminal conductor, there is also fear that the terminal conductor is deformed in the upward direction in an arcuate shape, in the same way as heretofore known, to a greater or lesser extent, meaning that it is preferable to apply the invention.

Also, the components of the semiconductor device illustrated in the heretofore described embodiment can be replaced with other respective components having the same functions. Also, another optional component may be provided, apart from the heretofore described components of the semiconductor device, or another step may be added to the heretofore described steps of manufacturing the semiconductor device in order to provide the optional component. Also, in the heretofore described embodiment, a description has been given, as an example, of the case of including two terminal conductors, but the invention, not being limited to this, is also effective in, for example, the case of including three or more terminal conductors, each of which is opposed to and spaced a fixed distance from an adjacent terminal conductor.

As above, the semiconductor device according to the invention is useful for a power semiconductor device of a structure wherein an insulating substrate on which semiconductor elements are mounted is mounted on a heat dissipation metal base plate, and the insulating substrate is covered with a surrounding case attached to the peripheral edge of the metal base plate.

What is claimed is:

1. A semiconductor device comprising:
    an insulating substrate on which semiconductor elements are mounted;
    a surrounding case which surrounds the insulating substrate;
    at least two metal plate-like terminal conductors which are disposed on the top of the insulating substrate, parallel to the front surface of the insulating substrate, so as to be opposed to and spaced away from each other so that the distances between the terminal conductors and the insulating substrate are different from each other, and both ends of each of which are fixed in sidewalls of the surrounding case; and
    an insulating block, disposed between the adjacent terminal conductors, for maintaining the distance between the adjacent terminal conductors at a fixed distance or greater,
    wherein the insulating block has a thickness greater than the distance between the terminal conductors and which corresponds to a predetermined dielectric strength voltage, the insulating block being disposed entirely within, and not in contact with, the surrounding case and in a portion in which one terminal conductor, when thermally deformed, comes nearest to the other terminal conductor,
    wherein one of the terminal conductors is disposed below the other terminal conductor of the terminal conductors, and
    wherein the insulating block is provided so as to encompass one portion of the other terminal of the terminal conductors at a portion of the other terminal that is disposed entirely within, and not in contact with, the surrounding case, and not encompass the one of the terminal conductors.

2. The semiconductor device according to claim 1, wherein
    the insulating block is formed from a polyphenylene sulfide resin or an epoxy resin.

3. The semiconductor device according to claim 1, wherein the distance between the terminal conductors kept by the insulating block is greater than or equal to 0.5 mm and less than or equal to 5 mm.

4. The semiconductor device according to claim 1, further comprising:
    a conductive foil formed on the insulating substrate in a predetermined pattern; and
    connection terminals, formed on the respective terminal conductors, which are soldered to the conductive foil, the semiconductor device being characterized in that
    the insulating block, by coming into contact with the terminal conductor, suppresses thermal deformation of the terminal conductor which is thermally expanded by heat when soldering the connection terminals and the conductive foil.

5. The semiconductor device according to claim 2, further comprising:
   a conductive foil formed on the insulating substrate in a predetermined pattern; and
   connection terminals, formed on the respective terminal conductors, which are soldered to the conductive foil, the semiconductor device being characterized in that
   the insulating block, by coming into contact with the terminal conductor, suppresses thermal deformation of the terminal conductor which is thermally expanded by heat when soldering the connection terminals and the conductive foil.

6. The semiconductor device according to claim 3, further comprising:
   a conductive foil formed on the insulating substrate in a predetermined pattern; and
   connection terminals, formed on the respective terminal conductors, which are soldered to the conductive foil, the semiconductor device being characterized in that
   the insulating block, by coming into contact with the terminal conductor, suppresses thermal deformation of the terminal conductor which is thermally expanded by heat when soldering the connection terminals and the conductive foil.

7. The semiconductor device according to claim 1, wherein connection terminals protruding downward from each of the terminal conductors are joined electrically to conductive foils on the insulating substrate; and
   the one of the terminal conductors is more deformable than the other of the terminal conductors.

8. The semiconductor device according to claim 7, wherein the one of the terminal conductors includes a linear shape and the other of the terminal conductors includes a trapezoidal frame-shape.

* * * * *